(12) United States Patent
Choi et al.

(10) Patent No.: US 12,419,157 B2
(45) Date of Patent: Sep. 16, 2025

(54) DOUBLE GATE THIN FILM TRANSISTOR DEVICE WITH MIXED SEMICONDUCTOR LAYERS

(71) Applicant: Samsung Display Co., Ltd., Yongin-si (KR)

(72) Inventors: Tae-Young Choi, Seoul (KR); Seung-Hwan Cho, Yongin-si (KR); Byoungtaek Son, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 457 days.

(21) Appl. No.: 17/450,504

(22) Filed: Oct. 11, 2021

(65) Prior Publication Data

US 2022/0246705 A1 Aug. 4, 2022

(30) Foreign Application Priority Data

Feb. 3, 2021 (KR) .................. 10-2021-0015509

(51) Int. Cl.
| | | |
|---|---|---|
| *H10K 59/121* | (2023.01) | |
| *H10D 30/67* | (2025.01) | |
| *H10D 86/40* | (2025.01) | |
| *H10D 86/60* | (2025.01) | |
| *H10H 29/10* | (2025.01) | |

(52) U.S. Cl.
CPC ..... *H10K 59/1213* (2023.02); *H10D 30/6734* (2025.01); *H10D 30/6743* (2025.01); *H10D 30/6755* (2025.01); *H10D 30/6757* (2025.01)

(58) Field of Classification Search
CPC .......... H10K 59/1213; H01L 29/78648; H01L 29/78651; H01L 29/7869; H01L 29/78696; H01L 27/1225; H01L 27/1251; H01L 27/124; H01L 27/156; H01L 29/41733
See application file for complete search history.

(56) References Cited

U.S. PATENT DOCUMENTS 8,115,201 B2 2/2012 Yamazaki et al.
2011/0266542 A1* 11/2011 Ryu .................. H01L 27/1225
257/66

(Continued)

FOREIGN PATENT DOCUMENTS

JP 2020-031206 A 2/2020
KR 10-2011-0099486 A 9/2011
(Continued)

OTHER PUBLICATIONS

Korean Office Action for KR Application 10-2021-0015509, dated Dec. 27, 2024, 11 pages.

*Primary Examiner* — Herve-Louis Y Assouman
(74) *Attorney, Agent, or Firm* — Womble Bond Dickinson (US) LLP

(57) ABSTRACT

A transistor may include an active layer including a first end area, a middle area adjacent to the first end area, and a second end area spaced from the first end area by the middle area, a first electrode on the active layer, overlapping the first end area, and connected to the first end area through a first contact hole, an upper gate electrode on the active layer, overlapping the middle area, at a same layer as the first electrode, and to receive a gate signal and a lower gate electrode under the active layer, overlapping the first contact hole and the middle area, and to receive the gate signal.

22 Claims, 12 Drawing Sheets

(56) References Cited

U.S. PATENT DOCUMENTS

| | | | |
|---|---|---|---|
| 2012/0146043 A1* | 6/2012 | Kitakado | H10D 30/6723 |
| | | | 257/E27.06 |
| 2016/0155858 A1* | 6/2016 | Yoo | H01L 29/78696 |
| | | | 257/66 |
| 2018/0166585 A1* | 6/2018 | Takechi | G09G 3/3266 |
| 2018/0190824 A1* | 7/2018 | Bae | H01L 29/66969 |
| 2020/0066765 A1 | 2/2020 | Cho et al. | |
| 2020/0335530 A1* | 10/2020 | Suzumura | H01L 29/66969 |
| 2021/0126022 A1* | 4/2021 | Luo | H01L 29/7869 |

FOREIGN PATENT DOCUMENTS

| | | |
|---|---|---|
| KR | 10-2019-0075424 A | 7/2019 |
| KR | 10-2020-0030751 A | 3/2020 |

* cited by examiner

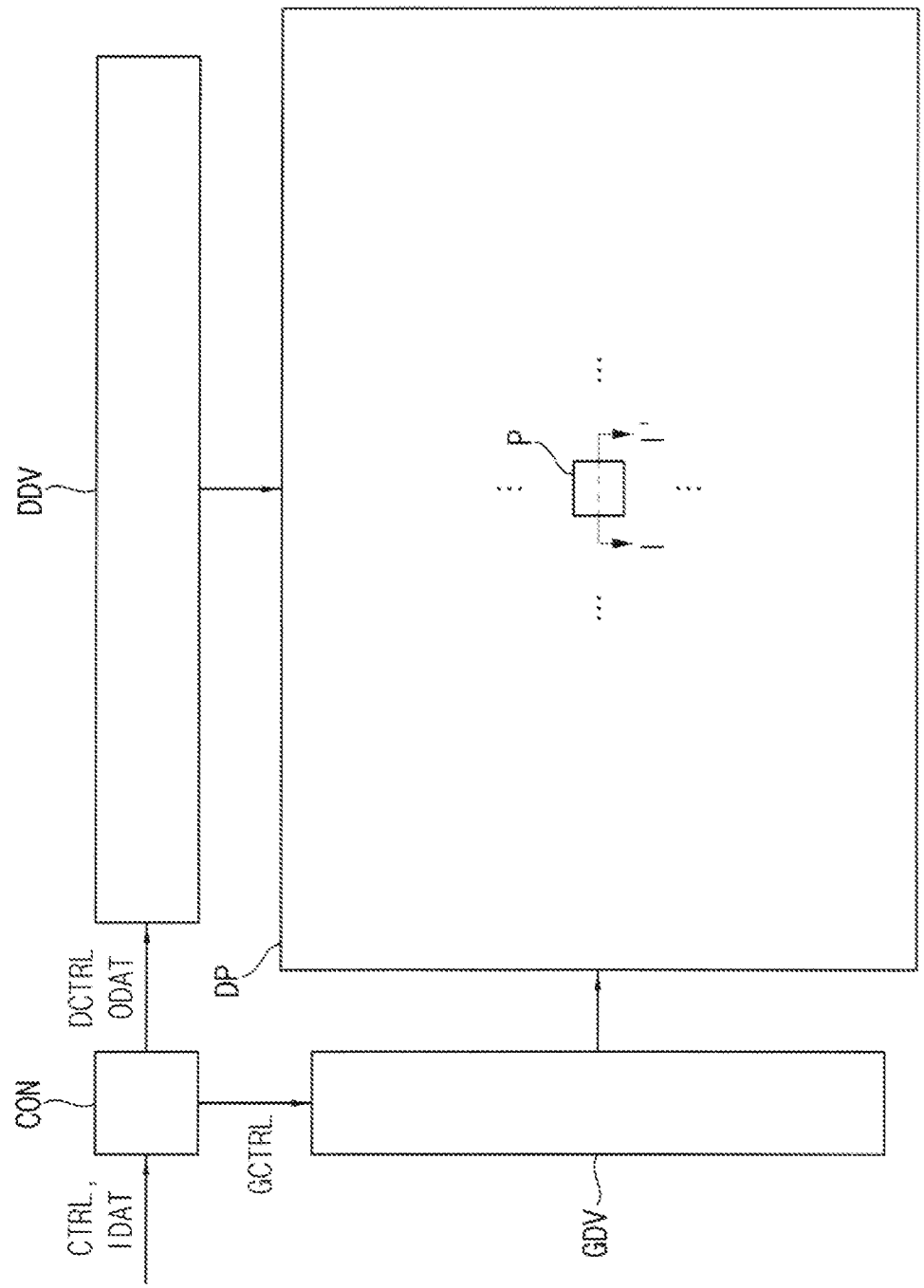

DOUBLE GATE THIN FILM TRANSISTOR DEVICE WITH MIXED SEMICONDUCTOR LAYERS

CROSS-REFERENCE TO RELATED APPLICATION(S)

This application claims priority to and the benefit of Korean Patent Application No. 10-2021-0015509 filed on Feb. 3, 2021 in the Korean Intellectual Property Office (KIPO), the entire disclosure of which is incorporated by reference herein.

BACKGROUND

1. Field

Embodiments relate to a transistor and a display device including the same. More particularly, embodiments relate to a transistor with reduced resistance and a display device including the same.

2. Description of the Related Art

A display device may include a plurality of transistors and lines connected to the transistors. As resistances of currents flowing through the transistors and the lines increase, driving efficiency of the display device may decrease. Accordingly, in order to efficiently drive the transistors and the lines, research for lowering the resistance of the transistors and the lines is being conducted.

For example, as impurities are not uniformly doped at opposite ends of an active layer of the transistor, the resistance of the active layer may increase. Accordingly, research is being conducted to increase the driving efficiency of the display device by allowing a current to efficiently flow in a portion where the impurities are not uniformly doped.

In addition, various studies are being conducted to miniaturize the transistor in order to display a high-resolution image.

SUMMARY

Aspects of one or more embodiments of the present disclosure are directed toward a transistor with reduced resistance and a display device including the same.

In an embodiment, a transistor may include an active layer including a first end area, a middle area adjacent to the first end area, and a second end area spaced from the first end area by the middle area, a first electrode on the active layer, overlapping the first end area, and connected to the first end area through a first contact hole, an upper gate electrode on the active layer, overlapping the middle area, at a same layer as the first electrode, and to receive a gate signal and a lower gate electrode under the active layer, overlapping the first contact hole and the middle area, and to receive the gate signal.

In an embodiment, the first end area may include a first area adjacent to the middle area and a second area spaced from the middle area by the first area. The second area of the first end area may overlap the first electrode. The first area of the first end area may not overlap the first electrode. The first area of the first end area may contain boron ions.

In an embodiment, the first electrode may be connected to the second area of the first end area through the first contact hole.

In an embodiment, the active layer may include an oxide-based semiconductor material.

In an embodiment, the active layer may include a silicon-based semiconductor material.

In an embodiment, the transistor may further include a second electrode on the active layer, overlapping the second end area, and connected to the second end area through a second contact hole.

In an embodiment, the second electrode may be at a same layer as the upper gate electrode.

In an embodiment, the lower gate electrode may overlap at least a portion of the second end area.

In an embodiment, the second end area may include a first area adjacent to the middle area and a second area spaced from the middle area by the first area. The first area of the second end area may contain boron ions.

In an embodiment, the second electrode may be connected to the second area of the second end area through the second contact hole.

In an embodiment, the second electrode may be on the upper gate electrode.

In an embodiment, a transistor may include an active layer including a first area, a second area, and a third area spaced from the first area by the second area, a lower gate electrode under the active layer and overlapping at least a portion of the first area, and the second area, and an electrode on the active layer, overlapping the first area and the second area, and connected to the first area through a contact hole.

In an embodiment, the third area may contain boron ions.

In an embodiment, the active layer may include an oxide-based semiconductor material.

In an embodiment, the active layer may include a silicon-based semiconductor material.

In an embodiment, the lower gate electrode may overlap the second area and the contact hole.

In an embodiment, a display device may include a substrate, a first active layer on the substrate, including a first end area, a middle area adjacent to the first end area, and a second end area spaced from the first end area by the middle area, a first electrode on the first active layer, overlapping the first end area, and connected to the first end area through a first contact hole, an upper gate electrode on the first active layer, overlapping the middle area, to receive a gate signal and a lower gate electrode between the substrate and the first active layer, overlapping at least a portion of the first end area and the middle area, and to receive the gate signal.

In an embodiment, the display device may further include a second active layer between the substrate and the first active layer.

In an embodiment, the first active layer may include an oxide-based semiconductor material. The second active layer includes a silicon-based semiconductor material.

In an embodiment, the second active layer may be connected to a light emitting element.

In an embodiment, the first end area may include a first area adjacent to the middle area and a second area spaced from the middle area by the first area. The first area of the first end area may contain boron ions.

In an embodiment, the first electrode may be connected to the second area of the first end area through the first contact hole.

In an embodiment, the upper gate electrode and the first electrode may be at a same layer.

In an embodiment, the display device may further include a second electrode on the first active layer, overlapping the second end area, and connected to the second end area through a second contact hole.

In an embodiment, the second electrode may be at a same layer as the upper gate electrode.

In an embodiment, the lower gate electrode may overlap the second end area.

In an embodiment, the second end area may include a first area adjacent to the middle area and a second area spaced from the middle area by the first area. The second area of the second end area may contain boron ions.

In an embodiment, the second electrode may be connected to the second area of the second end area through the second contact hole.

In an embodiment, the second electrode may be on the upper gate electrode.

Aspects of one or more embodiments of the present disclosure are directed toward a transistor that may include a lower gate electrode, an active layer on the lower gate electrode (e.g., on the lower gate electrode with a gate insulating layer therebetween), and an electrode disposed on the active layer and connected to the active layer through a contact hole. An impurity (e.g., boron ions) may not be doped in an area where the electrode and the active layer are connected because of the electrode.

However, the lower gate electrode may be disposed to overlap the area that is not doped with the impurity. Therefore, when a current is applied to the lower gate electrode, an electron concentration may be increased in the area that is not doped with the impurity. Accordingly, a current may smoothly flow even in the area that is not doped with the impurity.

Aspects of one or more embodiments of the present disclosure are directed towards a transistor including a region that is not doped with the impurity that may serve as a channel of the active layer. Accordingly, the transistor may include a shorter channel region than a related art transistor, and the transistor may be smaller than the related art transistor. That is, one or more embodiments of the present disclosure are directed toward a display device including a miniaturized transistor and capable of displaying a high-resolution image.

However, the aspects, features, and effects of the present disclosure are not limited to the above aspects, features, and effects, and various suitable changes in form and detail may be made without departing from the spirit and scope of the present disclosure.

BRIEF DESCRIPTION OF THE DRAWINGS

Illustrative, non-limiting embodiments will be more clearly understood from the following detailed description taken in conjunction with the accompanying drawings.

FIG. 1 is a plan view illustrating a display device according to embodiments.

DETAILED DESCRIPTION

Figure 2A:
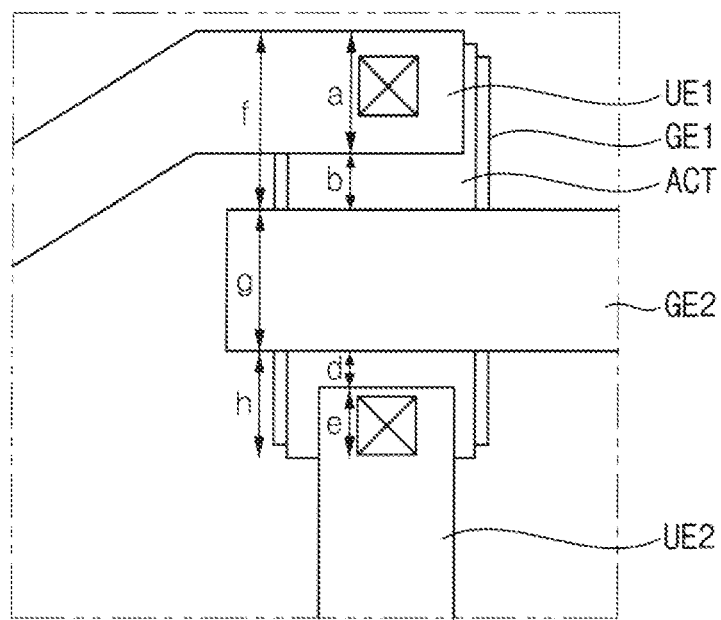
FIGS. 2A and 2B are plan views illustrating embodiments of pixels included in the display device of FIG. 1.

Hereinafter, a transistor and a display device including the same in accordance with embodiments will be explained in more detail with reference to the accompanying drawings. Like reference numerals in the drawings denote like elements throughout, and duplicative descriptions thereof may not be provided.

The terminology used herein is for the purpose of describing particular example embodiments only and is not intended to limit the example embodiments described herein.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the term "and/or" includes any and all combinations of one or more of the associated listed items.

Further, the use of "may" when describing embodiments of the present disclosure refers to "one or more embodiments of the present disclosure".

It will be understood that when an element is referred to as being "on," "connected to," or "coupled to" another element, it may be directly on, connected, or coupled to the other element or one or more intervening elements may also be present. When an element is referred to as being "directly on," "directly connected to," or "directly coupled to" another element, there are no intervening elements present.

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially" and similar terms are used as terms of approximation and not as terms of degree, and are intended to account for the inherent deviations in measured or calculated values that would be recognized by those of ordinary skill in the art.

Although the terms first, second, etc. may be used to describe various elements, these elements should not be limited by these terms. These terms are only used to distinguish one element from another element. For example, a first element may be referred to as a second element, and similarly, a second element may also be referred to as a first element without departing from the scope of the present invention.

Unless otherwise defined, all terms (including technical and scientific terms) used herein have the same meaning as commonly understood by one of ordinary skill in the art to which this disclosure pertains Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view illustrating a display device according to embodiments.

Referring to FIG. 1, the display device may include a display panel DP, a data driver DDV, a gate driver GDV, and a timing controller CON.

In embodiments, the display panel DP may be integrally formed. Alternatively, in embodiments, the display panel DP may include a plurality of sub-display panels.

The display panel DP may include a plurality of pixels P. Each of the plurality of pixels P may be connected to light emitting elements. The display panel DP may display an image through the light emitting elements. For example, the light emitting elements may include any one of an organic light emitting diode, a quantum-dot organic light emitting diode, and a quantum-dot nano light emitting diode. Alternatively, the display device may include a liquid crystal display device.

The timing controller CON may generate a gate control signal GCTRL, a data control signal DCTRL, and an output image data ODAT based on a control signal CTRL and an input image data IDAT provided from an outside. For example, the control signal CTRL may include a vertical synchronization signal, a horizontal synchronization signal, an input data enable signal, a master clock signal, and the like. For example, the input image data IDAT may be RGB data including red image data, green image data, and blue image data. Alternatively, the input image data IDAT may include magenta image data, cyan image data, and yellow image data.

The gate driver GDV may generate gate signals based on the gate control signal GCTRL provided from the timing controller CON. For example, the gate control signal GCTRL may include a vertical start signal, a clock signal, and the like.

The gate driver GDV may be connected (e.g., electrically connected) to the display panel DP and output (e.g., sequentially output) the gate signals. Each of the pixels may receive a data voltage according to control of each of the gate signals.

The data driver DDV may generate a data voltage based on the data control signal DCTRL provided from the timing controller CON and the output image data ODAT. For example, the data control signal DCTRL may include an output data enable signal, a horizontal start signal, a load signal, and the like.

The data driver DDV may be connected (e.g., electrically connected) to the display panel DP and may generate a plurality of data voltages. Each of the pixels may transmit a luminance signal corresponding to each of the data voltages to the light emitting elements.

Figure 2B:
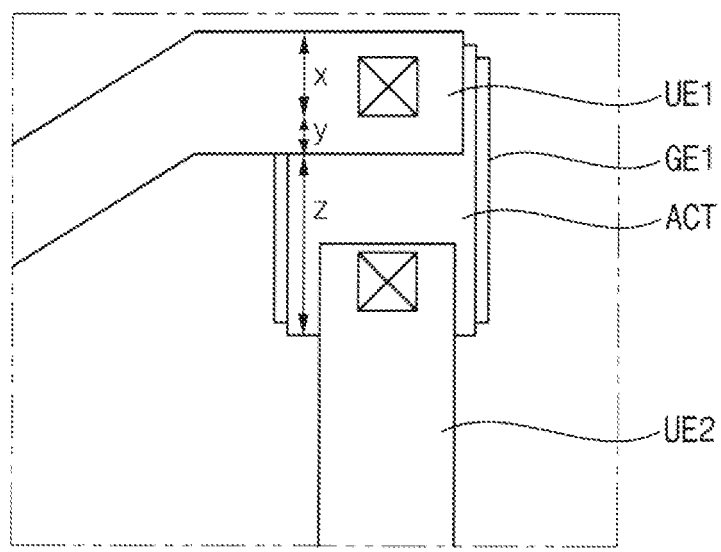

FIGS. 2A and 2B are plan views illustrating embodiments of pixels included in the display device of FIG. 1.

Referring to FIGS. 1 and 2A, each of the pixels P may include a first gate electrode GE1, an active layer ACT, a second gate electrode GE2, a first upper electrode UE1, and a second upper electrode UE2.

The first gate electrode GE1 may include a conductive material. For example, the first gate electrode GE1 may include a metal, an alloy, a conductive metal oxide, a transparent conductive material, or the like.

The active layer ACT may be disposed on the first gate electrode GE1. The active layer ACT may overlap (e.g., overlap in a thickness direction of the display device) the first gate electrode GE1. In embodiments, the active layer ACT may include a semiconductor material. For example, the active layer ACT may include an oxide-based semiconductor material or a silicon-based semiconductor material.

The second gate electrode GE2 may be disposed on the active layer ACT. The second gate electrode GE2 may overlap (e.g., overlap in the thickness direction of the display device) the active layer ACT. The second gate electrode GE2 may include a conductive material. For example, the second gate electrode GE2 may include a metal, an alloy, a conductive metal oxide, a transparent conductive material, or the like.

The first upper electrode UE1 may be disposed on the active layer ACT. In embodiments, the first upper electrode UE1 may be disposed on or at the same layer as the second gate electrode GE2, or may be disposed on or at a layer higher than the second gate electrode GE2. The first upper electrode UE1 may overlap (e.g., overlap in the thickness direction of the display device) the active layer ACT. The first upper electrode UE1 may be connected to the active layer ACT by (or through) a contact hole. In embodiments, the first upper electrode UE1 may overlap (e.g., overlap in the thickness direction of the display device) a partial area (a) of the active layer ACT.

In embodiments, the first upper electrode UE1 may serve as a mask when the active layer ACT is doped with ions. For example, ions may not be doped into the partial area (a) of the active layer ACT by the first upper electrode UE1. Accordingly, current may not smoothly flow in the partial region (a) of the active layer ACT.

However, in the display device according to the embodiments of the present disclosure, the first gate electrode GE1 is disposed to overlap (e.g., overlap in the thickness direction of the display device) from the lower portion of the active layer ACT to the partial area (a) of the active layer ACT, an electron concentration of the partial area (a) of the active layer ACT may be increased. This will be described in more detail with reference to the drawings (e.g., FIGS. 3-7) to be described later.

The second upper electrode UE2 may be disposed on the active layer ACT. In embodiments, the second upper electrode UE2 may be disposed on or at the same layer as the second gate electrode GE2, or may be disposed on or at a layer higher than the second gate electrode GE2. The second upper electrode UE2 may overlap (e.g., overlap in the thickness direction of the display device) the active layer ACT. The second upper electrode UE2 may be connected to the active layer ACT by a contact hole. In embodiments, the second upper electrode UE2 may overlap (e.g., overlap in the thickness direction of the display device) a partial area (e) of the active layer ACT.

Referring to FIGS. 1 and 2B, FIG. 2B may be substantially the same as FIG. 2A except that the second gate electrode GE2 is excluded from FIG. 2A. In embodiments, the first upper electrode UE1 may serve as a mask when the active layer ACT is doped with ions. Accordingly, ions may not be doped into a first area (x) and a second area (y).

In some embodiments, the second area (y) may serve as a channel because ions are not doped, and the first area (x) may serve as a source due to an increase in electron concentration during a contact hole formation process. In addition, an area that does not overlap the active layer ACT, and the first upper electrode UE1 and the second upper electrode UE2 may be doped with ions. Accordingly, a third area (z) may serve as a drain. This will be described in more detail with reference to the drawings (e.g., FIGS. 8-12) to be described later.

Figure 3:
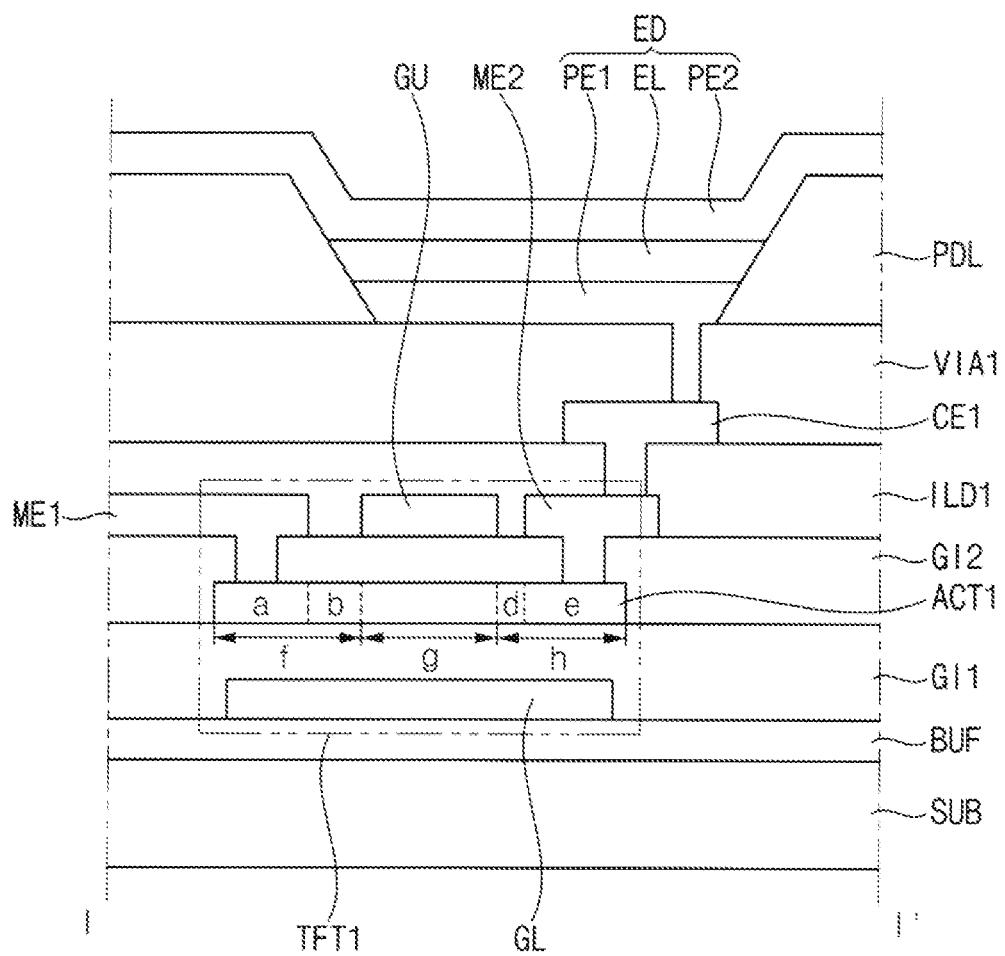
FIG. 3 is a cross-sectional view illustrating embodiments taken along the line I-I' of FIG. 1.

FIG. 3 is a cross-sectional view illustrating embodiments taken along the line I-I' of FIG. 1.

Referring to FIGS. 1, 2A and 3, the display device may include a substrate SUB, a buffer layer BUF, a lower gate electrode GL, a first gate insulating layer GI1, a first active layer ACT1, a second gate insulating layer GI2, a first electrode ME1, a second electrode ME2, an upper gate electrode GU, a first interlayer insulating layer ILD1, a first connection electrode CE1, a first via insulating layer VIA1, a pixel defining layer PDL and a light emitting element ED. The light emitting element ED may include a first pixel electrode PE1, an intermediate layer EL, and a second pixel electrode PE2. The lower gate electrode GL, the first active layer ACT1, the first electrode ME1, the second electrode ME2, and the upper gate electrode GU may constitute a first transistor TFT1.

The substrate SUB may include glass, quartz, plastic, or the like. In embodiments, the substrate SUB may include plastic, and thus the display device may have a flexible characteristic. In this case, the substrate SUB may have a structure in which at least one organic film layer and at least one barrier layer are stacked (e.g., alternately stacked). For example, the organic film layer may be formed using an organic material such as polyimide, and the barrier layer may be formed using an inorganic material.

The buffer layer BUF may be disposed on the substrate SUB. The buffer layer BUF may prevent or reduce diffusion of metal atoms or impurities from the substrate SUB to the lower gate electrode GL, the first active layer ACT1, and the like. In addition, the buffer layer BUF may control a heat supply rate during a crystallization process for forming the lower gate electrode GL, and the first active layer ACT1 may be uniformly formed.

The lower gate electrode GL may be disposed on the buffer layer BUF. The lower gate electrode GL may include a conductive material. For example, the lower gate electrode GL may include a metal, an alloy, a conductive metal oxide, a transparent conductive material, or the like. For example, the lower gate electrode GL may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and/or the like. A gate signal for activating the first active layer ACT1 may be applied to the lower gate electrode GL.

The first gate insulating layer GI1 may be disposed on the buffer layer BUF to cover the lower gate electrode GL. The first gate insulating layer GI1 may include silicon oxide ("$SiO_x$"), silicon nitride ("$SiN_x$"), silicon oxynitride ("$SiN_xO_y$"), and/or the like. The first gate insulating layer GI1 may be disposed to have a flat top surface. However, in embodiments, the first gate insulating layer GI1 may be disposed to have substantially the same thickness along the profile of the lower gate electrode GL. This may be equally applied to an insulating layer or the like described below.

The first active layer ACT1 may be disposed on the first gate insulating layer GI1. The first active layer ACT1 may include a first end area (f), a middle area (g), and a second end area (h). The second end area (h) may be spaced from the first end area (f) by the middle area (g). The first end area (f) may include a first area (b) adjacent to the middle area (g). In addition, the first end area (f) may further include a second area (a) spaced from the middle area (g) by the first area (b). The second end area (h) may include a first area (d) adjacent to the middle area (g). The second end area (h) may further include a second area (e) spaced from the middle area (g) by the first area (d).

In embodiments, the first active layer ACT1 may include an oxide-based semiconductor material. For example, the oxide-based semiconductor material may include zinc oxide ("$ZnO_x$"), tin oxide ("$SnO_x$"), indium oxide ("$InO_x$"), indium-zinc oxide IZO, indium-gallium oxide IGO, zinc-tin oxide ("$ZnSn_xO_y$"), and/or indium-gallium-zinc oxide IGZO.

Alternatively, in embodiments, the first active layer ACT1 may include a silicon-based semiconductor material. For example, the silicon-based semiconductor material may include amorphous silicon, polycrystalline silicon, and/or the like.

The second gate insulating layer GI2 may be disposed on the first gate insulating layer GI1 to cover the first active layer ACT1. The second gate insulating layer GI2 may include silicon oxide ("$SiO_x$"), silicon nitride ("$SiN_x$"), silicon oxynitride ("$SiN_xO_y$"), and/or the like.

The first electrode ME1 may be disposed on the second gate insulating layer GI2. Various suitable signals may be applied to the first electrode ME1. For example, a high power voltage, a data voltage, an initialization voltage, etc. may be applied to the first electrode ME1.

In embodiments, the first electrode ME1 may overlap (e.g., overlap in a thickness direction of the substrate SUB) the second area (a). The first electrode ME1 may serve as a mask when the first active layer ACT1 is doped with impurities. For example, when boron ions are doped into the first active layer ACT1, the first electrode ME1 may mask the second area (a). Accordingly, boron ions may not be doped into the second area (a) of the first active layer ACT1.

When the first end area (f) is doped with boron ions, the resistance of the first end area (f) may be lowered. Preferably, the first end area (f) of the first active layer ACT1 may be entirely doped with boron ions. However, the second area (a) is not doped with boron ions because of the first electrode ME1, and thus the second area (a) may have a high resistance.

In the display device according to embodiments, as the lower gate electrode GL overlaps (e.g., overlaps in the thickness direction of the substrate SUB) the first end area (f), the resistance of the second area (a) may be lowered. When a signal is applied to the lower gate electrode GL, the middle area (g) serving as a channel may be activated. When a signal is applied to the lower gate electrode GL, in the same way that the first active layer ACT1 is affected, the second area (a) may be affected when the signal is applied to the lower gate electrode GL. Accordingly, the electron concentration is increased in the second area (a), so that the current may flow efficiently. In embodiments, the lower gate electrode GL may overlap (e.g., overlap in the thickness direction of the substrate SUB) at least a portion of the second area (a) of the first end area (f). The lower gate electrode GL may overlap (e.g., overlap in the thickness direction of the substrate SUB) at least a portion of the second area (e) of the second end area (h).

The upper gate electrode GU may be disposed on the second gate insulating layer GI2. The upper gate electrode GU may overlap (e.g., overlap in the thickness direction of the substrate SUB) the middle area (g) of the first active layer ACT1. The upper gate electrode GU may serve to activate the first active layer ACT1 together with the lower gate electrode GL. In embodiments, the upper gate electrode GU may mask doping of boron ions into the middle area (g) of the first active layer ACT1. Accordingly, boron ions may not be doped in the middle area (g). Accordingly, the middle area (g) may be a channel area serving as a channel.

The upper gate electrode GU may include the same material as the lower gate electrode GL. That is, the upper gate electrode GU may include a conductive material. For example, the upper gate electrode GU may include a metal, an alloy, a conductive metal oxide, a transparent conductive material, and/or the like. In embodiments, a same signal may be applied to the upper gate electrode GU and the lower gate electrode GL.

The second electrode ME2 may be disposed on the second gate insulating layer GI2. In embodiments, the second electrode ME2 may overlap (e.g., overlap in the thickness direction of the substrate SUB) the second area (e) of the first active layer ACT1. Accordingly, boron ions may not be doped into the second area (e) of the first active layer ACT1 by the second electrode ME2. In this case, because boron ions are not doped in the second area (e), a signal may not smoothly flow in the second end area (h).

In the display device according to embodiments, as the lower gate electrode GL overlaps (e.g., overlaps in the thickness direction of the substrate SUB) the second end area (h), the resistance of the second area (e) may be lowered. That is, when a signal is applied to the lower gate electrode GL, the second area (e) is affected, so that the electron concentration in the second area (e) increases, so that a current may flow efficiently.

In embodiments, the first electrode ME1 is connected to the second area (a) of the first end area (f) by a contact hole (e.g., a contact hole extending through the second gate insulating layer GI2), and the second electrode ME2 is connected to the second area (e) of the second end area (h) by a contact hole (e.g., a contact hole extending through the second gate insulating layer GI2). Accordingly, the signal applied to the first electrode ME1 may flow to the second electrode ME2 through the first active layer ACT1. At this time, in the second area (a) of the first end area (f) and the second area (e) of the second end area (h) not doped with impurities (e.g., boron ions) by the first electrode ME1 and the second electrode ME2, the electron concentration is increased by the lower gate electrode GL, so that the current may flow efficiently.

The first interlayer insulating layer ILD1 may be disposed on the second gate insulating layer GI2 to cover the first electrode ME1, the upper gate electrode GU, and the second electrode ME2. The first interlayer insulating layer ILD1 may include a silicon compound, a metal oxide, or the like. For example, the first interlayer insulating layer ILD1 may include silicon oxide ("$SiO_x$"), silicon nitride ("$SiN_x$"), silicon oxynitride ("$SiN_xO_y$"), and/or the like.

The first connection electrode CE1 may be disposed on the first interlayer insulating layer ILD1. In embodiments, the first connection electrode CE1 may be connected to the second electrode ME2 through a contact hole (e.g., a contact hole extending through the first interlayer insulating layer ILD1). Through this, the signal applied to the first electrode ME1 may be transmitted to the first connection electrode CE1. The first connection electrode CE1 may include a metal, an alloy, a conductive metal oxide, a transparent conductive material, or the like.

The first via insulating layer VIA1 may cover the first connection electrode ME1 and may be disposed on the first interlayer insulating layer ILD1. In embodiments, the first via insulating layer VIA1 may be subjected to a planarization process for disposing the light emitting element ED. Accordingly, the first via insulating layer VIA1 may have a flat top surface. The first via insulating layer VIA1 may include a silicon compound, a metal oxide, and/or the like. Alternatively, the first via insulating layer VIA1 may be formed of an organic insulating material such as polyimide ("PI").

The pixel defining layer PDL may be disposed on the first via insulating layer VIA1. The pixel defining layer PDL may include an opening in which the light emitting element ED is disposed. In embodiments, the pixel defining layer PDL may include an organic insulating material. For example, the pixel defining layer PDL may include an organic insulating material such as polyimide ("PI") or hexamethyldisiloxane.

The first pixel electrode PE1 may be disposed on the first via insulating layer VIA1 in the opening of the pixel defining layer PDL. The first pixel electrode PE1 may be connected to the first connection electrode CE1 through a contact hole (e.g., a contact hole extending through the first via insulating layer VIA1). In embodiments, the first pixel electrode PE1 may be an anode electrode. The first pixel electrode PE1 may be formed of a conductive material such as a metal, an alloy, or a transparent conductive oxide. For example, the conductive material may include silver ("Ag"), indium-tin oxide ("ITO"), or the like.

The intermediate layer EL may be disposed on the first pixel electrode PE1. In embodiments, the intermediate layer EL may include an organic light emitting material. In this case, the organic light emitting material may include a low molecular weight organic compound or a high molecular weight organic compound. Alternatively, in embodiments, the intermediate layer EL may include an inorganic light emitting material (e.g., gallium nitrate, etc.). The intermediate layer EL may be a light emitting layer that receives a signal from the first pixel electrode PE1 and the second pixel electrode PE2 and emits light.

The second pixel electrode PE2 may be disposed on the pixel defining layer PDL and the intermediate layer EL. The second pixel electrode PE2 may be formed of a conductive material such as a metal, an alloy, or a transparent conductive oxide. In embodiments, the second pixel electrode PE2 may be a cathode electrode. However, the present disclosure is not limited thereto. For example, when the first pixel electrode PE1 may be a cathode electrode, the second pixel electrode PE2 may be an anode electrode. Also, the first pixel electrode PE1 and the second pixel electrode PE2 may be connected to respective sides of the intermediate layer EL on the first via insulating layer VIA1.

Figure 4:
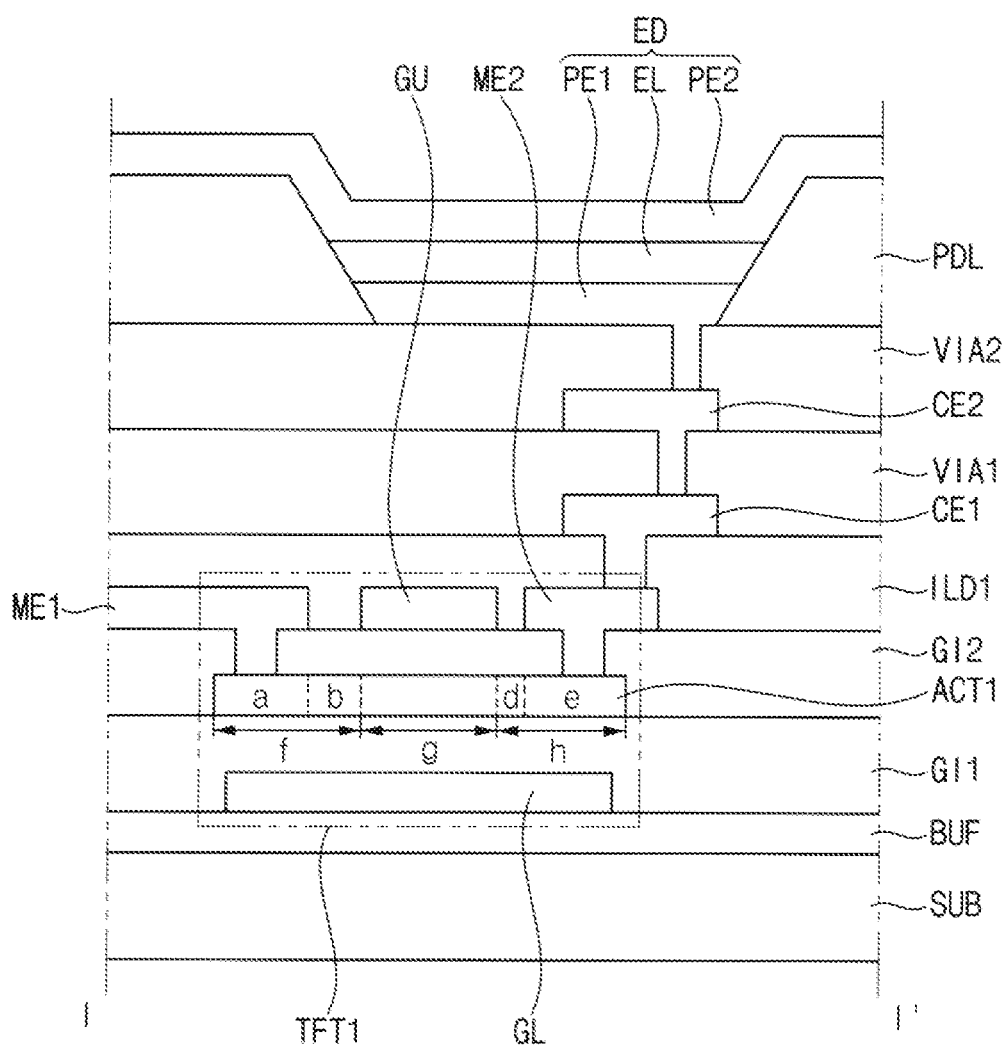
FIG. 4 is a cross-sectional view illustrating embodiments taken along the line I-I' of FIG. 1.

FIG. 4 is a cross-sectional view illustrating embodiments taken along the line I-I' of FIG. 1. FIG. 4 may be substantially the same as FIG. 3 except that a second connection electrode CE2 and a second via insulating layer VIA2 are disposed. Accordingly, a redundant description of the same or similar features may not be repeated.

Referring to FIGS. 1, 2A and 4, the display device may include a substrate SUB, a buffer layer BUF, a lower gate electrode GL, a first gate insulating layer GI1, a first active layer ACT1, a second gate insulating layer GI2, a first electrode ME1, a second electrode ME2, an upper gate electrode GU, a first interlayer insulating layer ILD1, a first connection electrode CE1, a first via insulating layer VIA1, a second connection electrode CE2, a second via insulating layer VIA2, a pixel defining layer PDL, and a light emitting element ED. The light emitting element ED may include a first pixel electrode PE1, an intermediate layer EL, and a second pixel electrode PE2.

The second connection electrode CE2 may be disposed on the first via insulating layer VIA1. The second connection electrode CE2 may include a metal, an alloy, a conductive metal oxide, a transparent conductive material, and/or the like. The second connection electrode CE2 may be connected to the first connection electrode CE1 through a contact hole (e.g., a contact hole extending through the first via insulating layer VIA1). As the second connection electrode CE2 is disposed, the display device may transmit a signal to the light emitting element ED through various suitable paths. That is, the display device may further include various suitable electrodes on or at the same layer as each of the first connection electrode CE1 and the second connection electrode CE2, and the electrodes may be connected to other lines to transmit signals. Accordingly, in the display device, the problem that the electrodes and the lines are disposed on or at the same layer and occupy a large area may be solved. That is, by disposing the electrodes and the lines on or at separate layers to transmit signals, a non-display area of the display device may be reduced, and thus, a wide display area of the display device may be secured.

The second via insulating layer VIA2 may cover the second connection electrode CE2 and may be disposed on the first via insulating layer VIA1. The second via insulating layer VIA2 may include the same material as the first via insulating layer VIA1.

Figure 5:
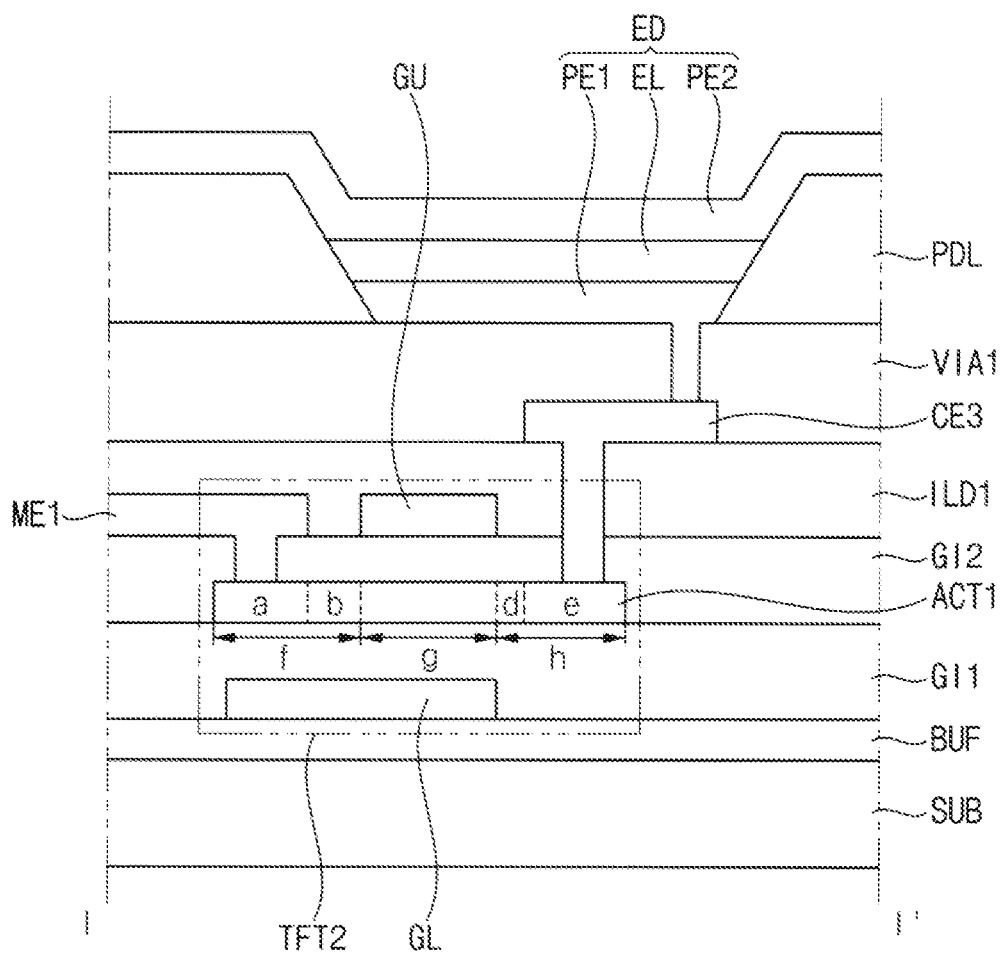
FIG. 5 is a cross-sectional view illustrating embodiments taken along the line I-I' of FIG. 1.

FIG. 5 is a cross-sectional view illustrating embodiments taken along the line I-I' of FIG. 1.

Referring to 2A and 5, the display device may include a substrate SUB, a buffer layer BUF, a lower gate electrode GL, a first gate insulating layer GI1, a first active layer ACT1, a second gate insulating layer GI2, a first electrode ME1, an upper gate electrode GU, a first interlayer insulating layer ILD1, a third connection electrode CE3, a first via insulating layer VIA1, a pixel defining layer PDL and a light emitting element ED. The light emitting element ED may include a first pixel electrode PE1, an intermediate layer EL, and a second pixel electrode PE2. The lower gate electrode GL, the first active layer ACT1, the first electrode ME1, and the upper gate electrode GU may constitute a second transistor TFT2.

The substrate SUB may include glass, quartz, plastic, and/or the like. In embodiments, the substrate SUB may include plastic, and thus the display device may have a flexible characteristic.

The buffer layer BUF may be disposed on the substrate SUB. The buffer layer BUF may prevent or reduce diffusion of metal atoms or impurities from the substrate SUB to the lower gate electrode GL, the first active layer ACT1, and the like.

The lower gate electrode GL may be disposed on the buffer layer BUF. The lower gate electrode GL may include a conductive material. For example, the lower gate electrode GL may include a metal, an alloy, a conductive metal oxide, a transparent conductive material, and/or the like.

The first gate insulating layer GI1 may be disposed on the buffer layer BUF to cover the lower gate electrode GL. The first gate insulating layer GI1 may include silicon oxide ("$SiO_x$"), silicon nitride ("$SiN_x$"), silicon oxynitride ("$SiN_xO_y$"), and/or the like.

The first active layer ACT1 may be disposed on the first gate insulating layer GI1. The first active layer ACT1 may include a first end area (f), a middle area (g), and a second end area (h). The first end area (f) may include a second area (a) spaced from the middle area (g) by the first area (b). The second end area (h) may include a first area (d) adjacent to the middle area (g). The second end area (h) may further include a second area (e) spaced from the middle area (g) by the first area (d).

In embodiments, the first active layer ACT1 may include an oxide-based semiconductor material. Alternatively, in embodiments, the first active layer ACT1 may include a silicon-based semiconductor material. For example, the silicon-based semiconductor material may include amorphous silicon, polycrystalline silicon, and/or the like.

The second gate insulating layer GI2 may be disposed on the first gate insulating layer GI1 to cover the first active layer ACT1. The second gate insulating layer GI2 may include silicon oxide ("$SiO_x$"), silicon nitride ("$SiN_x$"), silicon oxynitride ("$SiN_xO_y$"), and/or the like.

The first electrode ME1 may be disposed on the second gate insulating layer GI2. Various suitable signals may be applied to the first electrode ME1. For example, a high power voltage, a data voltage, an initialization voltage, etc. may be applied to the first electrode ME1.

In embodiments, the first electrode ME1 may overlap (e.g., overlap in the thickness direction of the substrate SUB) the second area (a). The first electrode ME1 may serve as a mask when the first active layer ACT1 is doped with impurities. For example, when boron ions are doped into the first active layer ACT1, the first electrode ME1 may mask the second area (a). Accordingly, boron ions may not be doped into the second area (a) of the first active layer ACT1.

When the first end area (f) is doped with boron ions, the resistance of the first end area (f) may be lowered. Preferably, the first end area (f) of the first active layer ACT1 may be entirely doped with boron ions. However, the second area (a) is not doped with boron ions because of the first electrode ME1, and thus the second area (a) may have a high resistance.

In the display device according to embodiments, as the lower gate electrode GL overlaps (e.g., overlaps in the thickness direction of the substrate SUB) the first end area (f), the resistance of the second area (a) may be lowered. When a signal is applied to the lower gate electrode GL, the middle area (g) serving as a channel may be activated. When a signal is applied to the lower gate electrode GL, in the same way that the first active layer ACT1 is affected, the second area (a) may be affected when the signal is applied to the lower gate electrode GL. Accordingly, the electron concentration is increased in the second area (a), so that the current may flow efficiently.

The upper gate electrode GU may be disposed on the second gate insulating layer GI2. The upper gate electrode GU may overlap (e.g., overlap in the thickness direction of the substrate SUB) the middle area (g) of the first active layer ACT1. The upper gate electrode GU may serve to activate the first active layer ACT1 together with the lower gate electrode GL. In embodiments, the upper gate electrode GU may mask doping of boron ions into the middle area (g) of the first active layer ACT1. Accordingly, boron ions may not be doped in the middle area (g).

The upper gate electrode GU may include the same material as the lower gate electrode GL. That is, the upper gate electrode GU may include a conductive material. For example, the upper gate electrode GU may include a metal, an alloy, a conductive metal oxide, a transparent conductive material, and/or the like.

An electrode may not be disposed in a portion overlapping the second end area (h) of the first active layer ACT1 between the second gate insulating layer GI2 and the first via insulating layer VIA1. Accordingly, the second end area (h) may be entirely doped with boron ions. In this case, the resistance of the second end area (h) may be reduced. Accordingly, the lower gate electrode GL may not be disposed to overlap (e.g., overlap in the thickness direction of the substrate SUB) the second end area (h) in order to increase the electron concentration of the second end area (h).

In embodiments, the first electrode ME1 may be connected to the second area (a) of the first end area (f) by a contact hole (e.g., a contact hole extending through the second gate insulating layer GI2). Accordingly, the signal applied to the first electrode ME1 may flow through the first active layer ACT1. At this time, the electron concentration is increased by the lower gate electrode GL in the second area (a) of the first end area (f) that is not doped with impurities (e.g., boron ions) because of the first electrode ME1, so that the current may flow efficiently.

The first interlayer insulating layer ILD1 may cover the first electrode ME1 and the upper gate electrode GU and may be disposed on the second gate insulating layer GI2. The first interlayer insulating layer ILD1 may include a silicon compound, a metal oxide, or the like.

The third connection electrode CE3 may be disposed on the first interlayer insulating layer ILD1. In embodiments, the third connection electrode CE3 may be connected to the first active layer ACT1 through a contact hole (e.g., a contact hole extending through the first interlayer insulating layer ILD1 and the second gate insulating layer GI2). Through this, the signal applied to the first electrode ME1 may be transmitted to the third connection electrode CE3. The third connection electrode CE3 may include a metal, an alloy, a conductive metal oxide, a transparent conductive material, and/or the like.

The first via insulating layer VIA1 may cover the third connection electrode CE3 and may be disposed on the first interlayer insulating layer ILD1. In embodiments, the first via insulating layer VIA1 may be subjected to a planarization process for disposing the light emitting element ED. Accordingly, the first via insulating layer VIA1 may have a flat top surface. The first via insulating layer VIA1 may include a silicon compound, a metal oxide, and/or the like. Alternatively, the first via insulating layer VIA1 may be formed of an organic insulating material such as polyimide ("PI").

The pixel defining layer PDL may be disposed on the first via insulating layer VIA1. The pixel defining layer PDL may include an opening in which the light emitting element ED is disposed. In embodiments, the pixel defining layer PDL may include an organic insulating material. For example, the pixel defining layer PDL may include an organic insulating material such as polyimide ("PI") or hexamethyldisiloxane.

The first pixel electrode PE1 may be disposed on the first via insulating layer VIA1 in the opening of the pixel defining layer PDL. The first pixel electrode PE1 may be connected to the third connection electrode CE3 through a contact hole (e.g., a contact hole extending through the first via insulating layer VIA1). In embodiments, the first pixel electrode PE1 may be an anode electrode. The first pixel electrode PE1 may be formed of a conductive material such as a metal, an alloy, and/or a transparent conductive oxide. For example, the conductive material may include silver ("Ag"), indium-tin oxide ("ITO"), and/or the like.

The intermediate layer EL may be disposed on the first pixel electrode PE1. In embodiments, the intermediate layer EL may include an organic light emitting material. In this case, the organic light emitting material may include a low molecular weight organic compound or a high molecular weight organic compound. Alternatively, in embodiments, the intermediate layer EL may include an inorganic light emitting material (e.g., gallium nitrate, etc.). The intermediate layer EL may be a light emitting layer that receives a signal from the first pixel electrode PE1 and the second pixel electrode PE2 and emits light.

The second pixel electrode PE2 may be disposed on the pixel defining layer PDL and the intermediate layer EL. The second pixel electrode PE2 may be formed of a conductive material such as a metal, an alloy, and/or a transparent conductive oxide. In embodiments, the second pixel electrode PE2 may be a cathode electrode. However, the present disclosure is not limited thereto. For example, when the first pixel electrode PE1 may be a cathode electrode, the second pixel electrode PE2 may be an anode electrode. Also, the first pixel electrode PE1 and the second pixel electrode PE2 may be connected to respective sides of the intermediate layer EL on the first via insulating layer VIA1.

Figure 6:
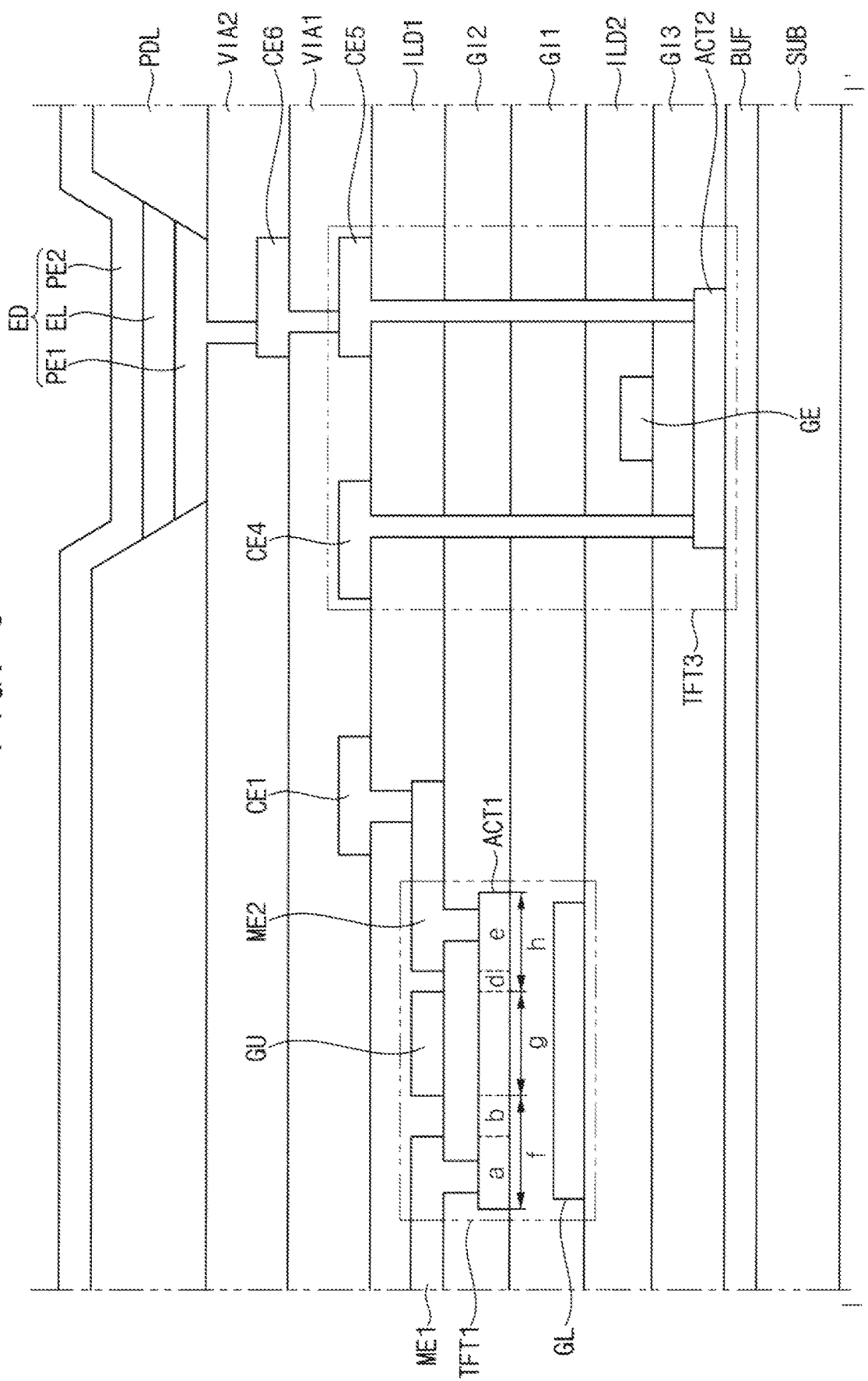
FIG. 6 is a cross-sectional view illustrating embodiments taken along the line I-I' of FIG. 1.

FIG. 6 is a cross-sectional view illustrating embodiments taken along the line I-I' of FIG. 1. FIG. 6 may be substantially the same as FIG. 4 except that a third gate insulating layer GI3, a second interlayer insulating layer ILD2, a second active layer ACT2, a gate electrode GE and fourth to sixth connection electrodes (i.e., a fourth connection electrode CE4, a fifth connection electrode CE5, and a sixth connection electrode CE6) are added. Accordingly, a redundant description of the same or similar features may not be repeated. The gate electrode GE, the second active layer ACT2, the fourth connection electrode CE4, and the fifth connection electrode CE5 may constitute a third transistor TFT3.

Referring to FIGS. 1, 2A, and 6, the second active layer ACT2 may be disposed on the buffer layer BUF. In embodiments, the second active layer ACT2 may include a silicon-based semiconductor material. In this case, the first active layer ACT1 may include an oxide-based semiconductor material.

The third gate insulating layer GI3 may cover the second active layer ACT2 and may be disposed on the buffer layer BUF. The third gate insulating layer GI3 may include an inorganic insulating material. For example, the inorganic insulating material may include silicon oxide ("$SiO_x$"), silicon nitride ("$SiN_x$"), silicon oxynitride ("$SiO_xN_y$"), and/or the like.

The gate electrode GE may be disposed on the third gate insulating layer GI3. The gate electrode GE may overlap (e.g., overlap in the thickness direction of the substrate SUB) the second active layer ACT2. The second interlayer insulating layer ILD2 may cover the gate electrode GE and may be disposed on the third gate insulating layer GI3. Accordingly, components disposed on the buffer layer BUF of FIG. 3 may be disposed on the second interlayer insulating layer ILD2.

The fourth connection electrode CE4 and the fifth connection electrode CE5 may be disposed on the first interlayer insulating layer ILD1. The fourth connection electrode CE4 may be connected to the second active layer ACT2 by a contact hole. The fifth connection electrode CE5 may be connected to the second active layer ACT2 by a contact hole.

The fourth connection electrode CE4 and the fifth connection electrode CE5 may include a conductive material.

The sixth connection electrode CE6 may be disposed on the first via insulating layer VIA1. The sixth connection electrode CE6 may be connected to the fifth connection electrode CE5 through a contact hole. Also, the sixth connection electrode CE6 may be connected to the light emitting element ED through a contact hole.

As such, the display device may secure high electron mobility by the first active layer ACT1 including an oxide-based semiconductor material. At the same time, the display device may reduce a leakage current by the second active layer ACT2 including a silicon-based semiconductor material.

Figure 7:
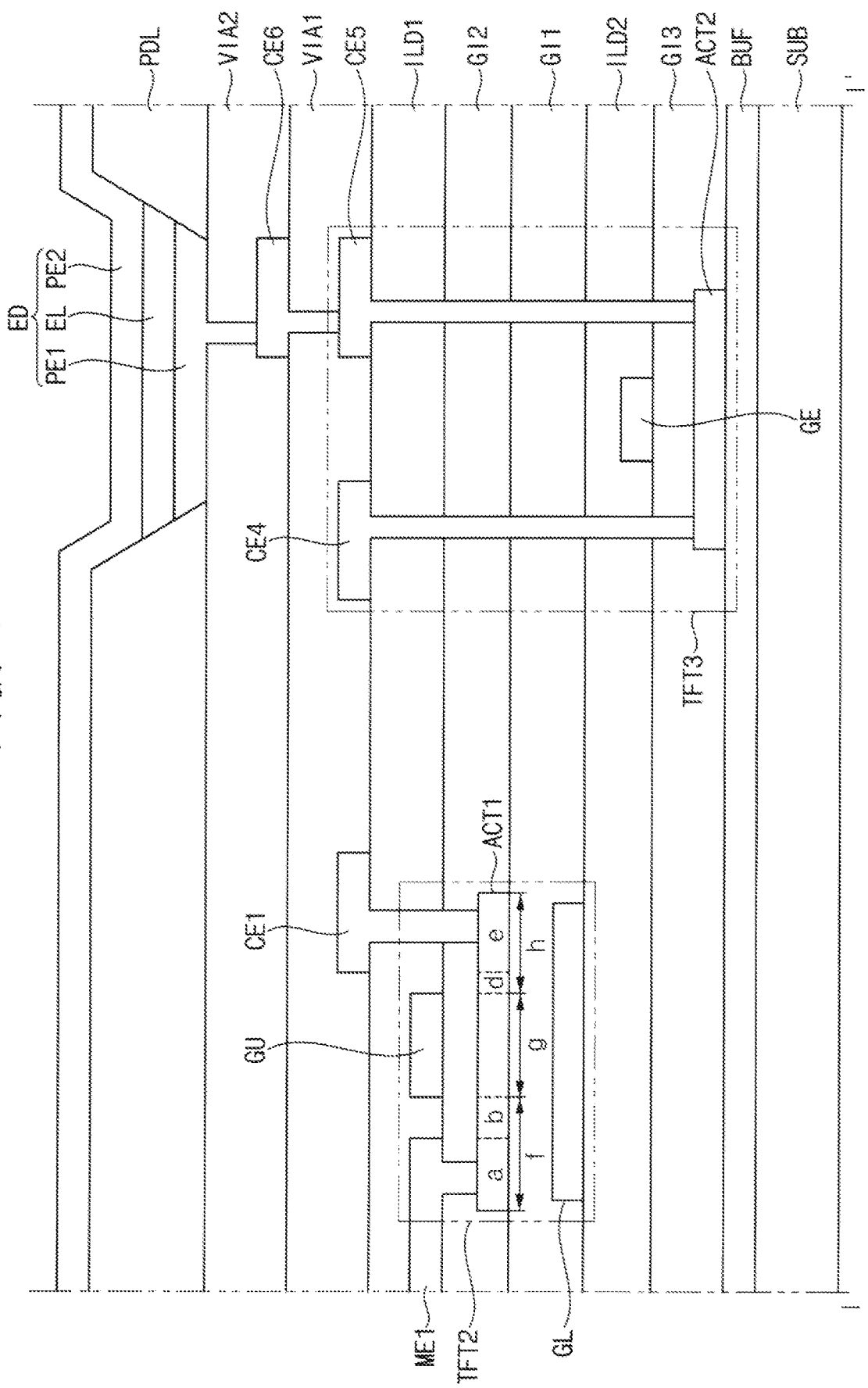
FIG. 7 is a cross-sectional view illustrating embodiments taken along the line I-I' of FIG. 1.

FIG. 7 is a cross-sectional view illustrating embodiments taken along the line I-I' of FIG. 1. FIG. 7 may be substantially the same as FIG. 5 except that a third gate insulating layer GI3, a second interlayer insulating layer ILD2, a second active layer ACT2, a gate electrode GE and fourth to sixth connection electrodes CE4, CE5, CE6 are added. Accordingly, a redundant description of the same or similar features may not be repeated.

Referring to FIGS. 1, 2A and 7, the second active layer ACT2 may be disposed on the buffer layer BUF. In embodiments, the second active layer ACT2 may include a silicon-based semiconductor material. In this case, the first active layer ACT1 may include an oxide-based semiconductor material.

The third gate insulating layer GI3 may cover the second active layer ACT2 and may be disposed on the buffer layer BUF. The third gate insulating layer GI3 may include an inorganic insulating material. For example, the inorganic insulating material may include silicon oxide ("SiO$_x$"), silicon nitride ("SiN$_x$"), silicon oxynitride ("SiO$_x$N$_y$"), and/or the like.

The gate electrode GE may be disposed on the third gate insulating layer GI3. The gate electrode GE may overlap (e.g., overlap in the thickness direction of the substrate SUB) the second active layer ACT2. The second interlayer insulating layer ILD2 may cover the gate electrode GE and may be disposed on the third gate insulating layer GI3. Accordingly, the structure disposed on the buffer layer BUF of FIG. 3 may be disposed on the second interlayer insulating layer ILD2.

The fourth connection electrode CE4 and the fifth connection electrode CE5 may be disposed on the first interlayer insulating layer ILD1. The fourth connection electrode CE4 may be connected to the second active layer ACT2 by a contact hole. The fifth connection electrode CE5 may be connected to the second active layer ACT2 by a contact hole. The fourth connection electrode CE4 and the fifth connection electrode CE5 may include a conductive material.

The sixth connection electrode CE6 may be disposed on the first via insulating layer VIA1. The sixth connection electrode CE6 may be connected to the fifth connection electrode CE5 through a contact hole. Also, the sixth connection electrode CE6 may be connected to the light emitting element ED through a contact hole.

As such, the display device may secure high electron mobility by the first active layer ACT1 including an oxide-based semiconductor material. At the same time, the display device may reduce a leakage current by the second active layer ACT2 including a silicon-based semiconductor material.

Figure 8:
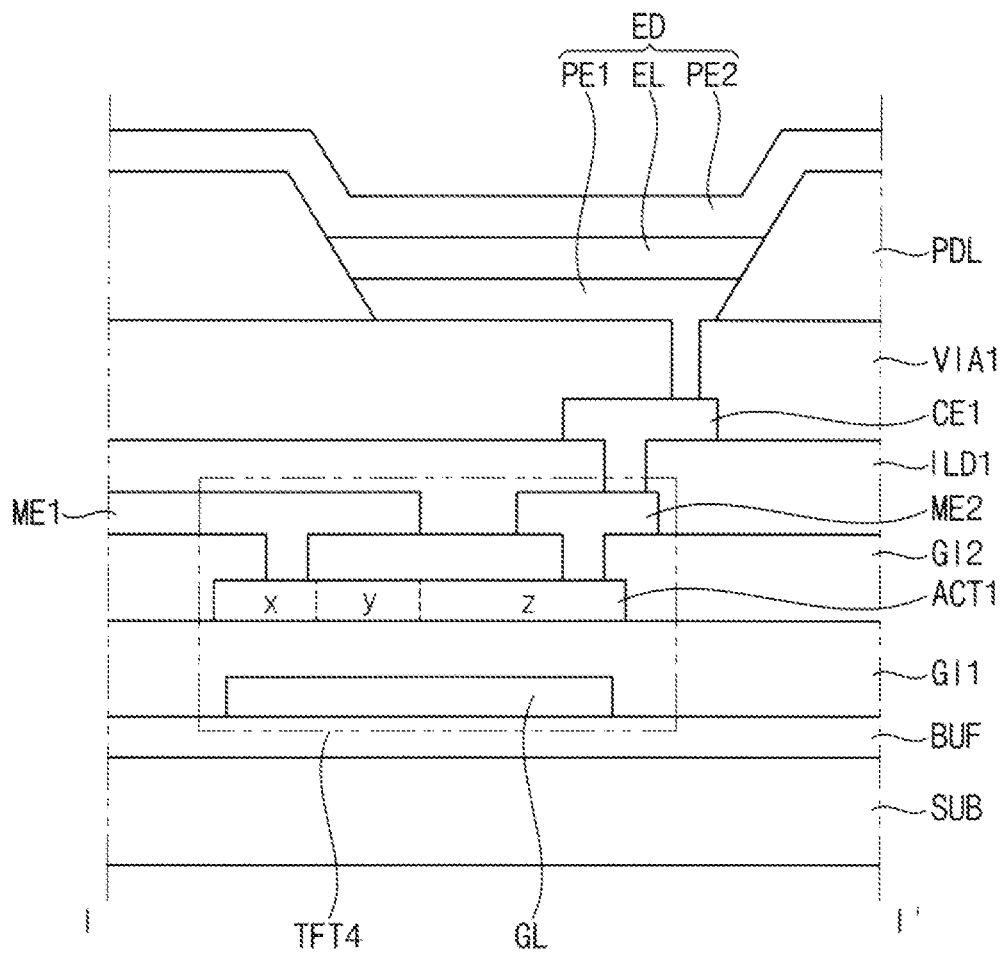
FIG. 8 is a cross-sectional view illustrating embodiments taken along the line I-I' of FIG. 1.
Figure 9:
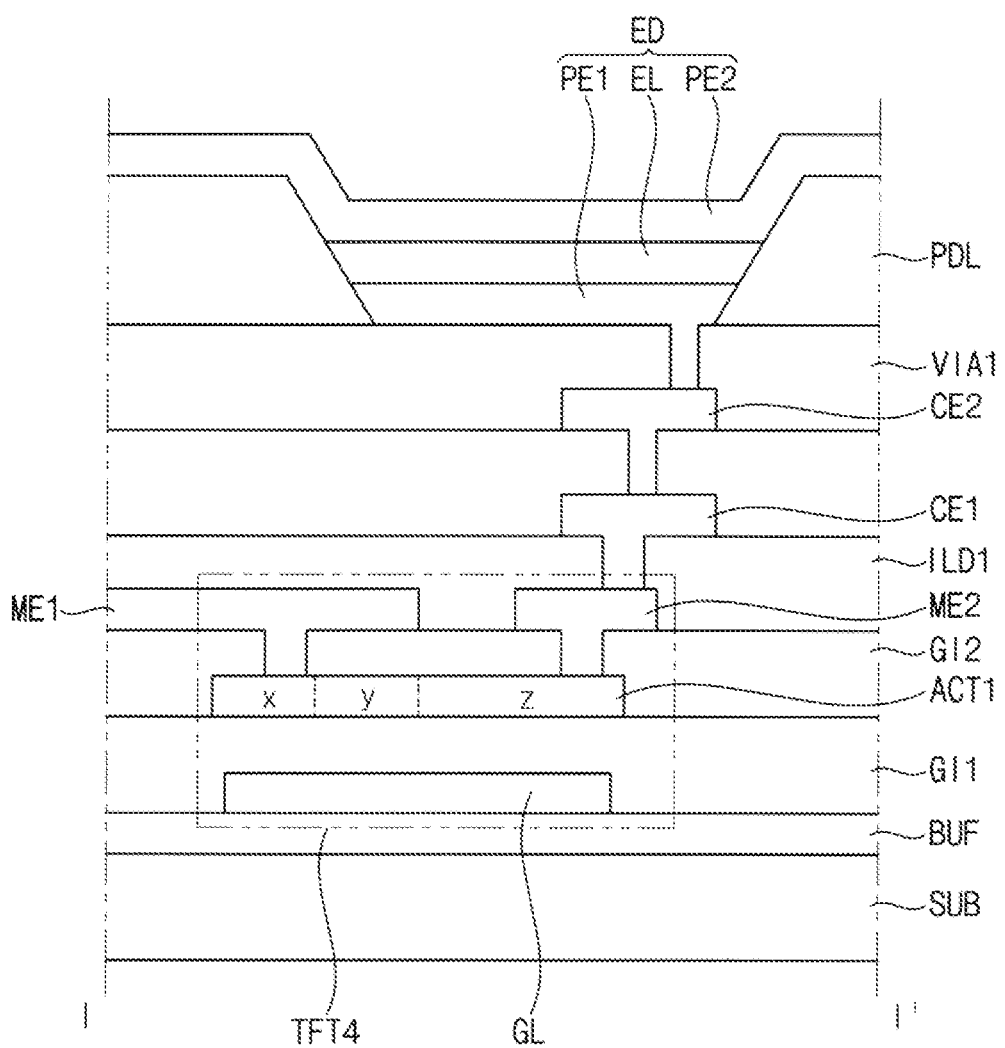
FIGS. 9, 10, 11 and 12 are cross-sectional views illustrating embodiments taken along the line I-I' of FIG. 1.

FIG. 8 is a cross-sectional view illustrating embodiments taken along the line I-I' of FIG. 1.

Referring to FIGS. 1, 2B and 8, the display device may include a substrate SUB, a buffer layer BUF, a lower gate electrode GL, a first gate insulating layer GI1, a first active layer ACT1, a second gate insulating layer GI2, a first electrode ME1, a second electrode ME2, a first interlayer insulating layer ILD1, a first connection electrode CE1, a first via insulating layer VIA1, a pixel defining layer PDL and a light emitting element ED. The light emitting element ED may include a first pixel electrode PE1, an intermediate layer EL, and a second pixel electrode PE2. The lower gate electrode GL, the first active layer ACT1, the first electrode ME1, and the second electrode ME2 may constitute a fourth transistor TFT4.

The substrate SUB may include glass, quartz, plastic, and/or the like. In embodiments, the substrate SUB may include plastic, and thus the display device may have a flexible characteristic. In this case, the substrate SUB may have a structure in which at least one organic film layer and at least one barrier layer are stacked (e.g., alternately stacked). For example, the organic film layer may be formed using an organic material such as polyimide, and the barrier layer may be formed using an inorganic material.

The buffer layer BUF may be disposed on the substrate SUB. The buffer layer BUF may prevent or reduce diffusion of metal atoms or impurities from the substrate SUB to the lower gate electrode GL, the first active layer ACT1, and the like. In addition, the buffer layer BUF may control a heat supply rate during a crystallization process for forming the lower gate electrode GL, and the first active layer ACT1 may be uniformly formed.

The lower gate electrode GL may be disposed on the buffer layer BUF. The lower gate electrode GL may include a conductive material. For example, the lower gate electrode GL may include a metal, an alloy, a conductive metal oxide, a transparent conductive material, or the like. For example, the lower gate electrode GL may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and/or the like. A gate signal for activating the first active layer ACT1 may be applied to the lower gate electrode GL.

The first gate insulating layer GI1 may be disposed on the buffer layer BUF to cover the lower gate electrode GL. The first gate insulating layer GI1 may include silicon oxide ("SiO$_x$"), silicon nitride ("SiN$_x$"), silicon oxynitride ("SiN$_x$O$_y$"), and/or the like. The first gate insulating layer GI1 may be disposed to have a flat top surface. However, in embodiments, the first gate insulating layer GI1 may be disposed to have substantially the same thickness along the profile of the lower gate electrode GL. This may be equally applied to an insulating layer or the like described below.

The first active layer ACT1 may be disposed on the first gate insulating layer GI1. The first active layer ACT1 may include a first area x, a second area y, and a third area z. The third area z may be spaced from the first area x by the second area y.

In embodiments, the first active layer ACT1 may include an oxide-based semiconductor material. For example, the oxide-based semiconductor material may include zinc oxide ("ZnO$_x$"), tin oxide ("SnO$_x$"), indium oxide ("InO$_x$"), indium-zinc oxide IZO, indium-gallium oxide IGO, zinc-tin oxide ("ZnSn$_x$O$_y$"), and/or indium-gallium-zinc oxide IGZO.

Alternatively, in embodiments, the first active layer ACT1 may include a silicon-based semiconductor material. For example, the silicon-based semiconductor material may include amorphous silicon, polycrystalline silicon, and/or the like.

The second gate insulating layer GI2 may be disposed on the first gate insulating layer GI1 to cover the first active layer ACT1. The second gate insulating layer GI2 may include silicon oxide ("$SiO_x$"), silicon nitride ("$SiN_x$"), silicon oxynitride ("$SiN_xO_y$"), and/or the like.

The first electrode ME1 may be disposed on the second gate insulating layer GI2. Various suitable signals may be applied to the first electrode ME1. For example, a high power voltage, a data voltage, an initialization voltage, etc. may be applied to the first electrode ME1.

In embodiments, the first electrode ME1 may overlap (e.g., overlap in the thickness direction of the substrate SUB) the first area (x) and the second area (y). The first electrode ME1 may serve as a mask when the first active layer ACT1 is doped with impurities. For example, when boron ions are doped into the first active layer ACT1, the first electrode ME1 may mask the first area (x) and the second area (y). Accordingly, boron ions may not be doped into the first area (x) and the second area (y)

In embodiments, the second area (y) not doped with boron ions may be a channel area of the first active layer ACT1. In this case, the channel area may be shorter than the channel area in a related art transistor structure. Also, the first area (x) not doped with boron ions may be a source area or a drain area. For example, in the first area (x), an electron concentration may increase while a contact hole (e.g., a contact hole extending through the second gate insulating layer GI2) is formed to be connected to the first electrode MEI. Alternatively, in another example, a carrier concentration of the first area (x) may increase while a contact hole (e.g., a contact hole extending through the second gate insulating layer GI2) is formed to be connected to the first electrode ME1. Accordingly, the first area (x) may be a source or a drain area of the first active layer ACT1.

In this way, a channel area and a source area (or a drain area) may be formed in the first active layer ACT1 by the first electrode ME1. In this case, the upper gate electrode may not be disposed. In addition, because the first active layer ACT1 may be shorter than the active layer of the related art transistor, miniaturization of the transistor may be achieved. Accordingly, a high-resolution image may be displayed.

When the first area (x) is doped with boron ions, the resistance of the first area (x) may be reduced. Accordingly, it is preferable that the entire first area (x) be doped with boron ions. However, the first area (x) is not doped with boron ions because of the first electrode ME1, and thus, a problem of high resistance may occur in the first area (x).

In the display device according to embodiments, as the lower gate electrode GL overlaps (e.g., overlaps in the thickness direction of the substrate SUB) the first area (x), the resistance of the first area (x) may be lowered. When a signal is applied to the lower gate electrode GL, the second area (y) serving as a channel may be activated. When a signal is applied to the lower gate electrode GL, in the same way that the first active layer ACT1 is affected, the first area (x) may also be affected when a signal is provided to the lower gate electrode GL. Accordingly, the electron concentration is increased in the first area (x), so that the current may flow efficiently.

The second electrode ME2 may be disposed on the second gate insulating layer GI2. In embodiments, the second electrode ME2 may overlap (e.g., overlap in the thickness direction of the substrate SUB) the third area (z) of the first active layer ACT1. Boron ions may not be doped into the third area (z) because of the second electrode ME2. In this case, because boron ions are not doped in the third area (z), current may not flow smoothly in the third area (z).

In the display device according to embodiments, as the lower gate electrode GL overlaps (e.g., overlaps in the thickness direction of the substrate SUB) the third area (z), the resistance of the third area (z) may be lowered. That is, when a signal is applied to the lower gate electrode GL, the third area (z) is affected, so that the electron concentration in the third area (z) increases, so that a current may flow efficiently.

The first interlayer insulating layer ILD1 may cover the first electrode ME1 and the second electrode ME2 and may be disposed on the second gate insulating layer GI2. The first interlayer insulating layer ILD1 may include a silicon compound, a metal oxide, or the like. For example, the first interlayer insulating layer ILD1 may include silicon oxide ("$SiO_x$"), silicon nitride ("$SiN_x$"), silicon oxynitride ("$SiN_xO_y$"), or the like.

The first connection electrode CE1 may be disposed on the first interlayer insulating layer ILD1. In embodiments, the first connection electrode CE1 may be connected to the second electrode ME2 through a contact hole (e.g., a contact hole extending through the first interlayer insulating layer ILD1). Through this, the signal applied to the first electrode ME1 may be transmitted to the first connection electrode CE1. The first connection electrode CE1 may include a metal, an alloy, a conductive metal oxide, a transparent conductive material, and/or the like.

The first via insulating layer VIA1 may cover the first connection electrode ME1 and may be disposed on the first interlayer insulating layer ILD1. In embodiments, the first via insulating layer VIA1 may be subjected to a planarization process for disposing the light emitting element ED. Accordingly, the first via insulating layer VIA1 may have a flat top surface. The first via insulating layer VIA1 may include a silicon compound, a metal oxide, and/or the like. Alternatively, the first via insulating layer VIA1 may be formed of an organic insulating material such as polyimide ("PI").

The pixel defining layer PDL may be disposed on the first via insulating layer VIA1. The pixel defining layer PDL may include an opening in which the light emitting element ED is disposed. In embodiments, the pixel defining layer PDL may include an organic insulating material. For example, the pixel defining layer PDL may include an organic insulating material such as polyimide ("PI") or hexamethyldisiloxane.

The first pixel electrode PE1 may be disposed on the first via insulating layer VIA1 in the opening of the pixel defining layer PDL. The first pixel electrode PE1 may be connected to the first connection electrode CE1 through a contact hole (e.g., a contact hole extending through the first via insulating layer VIA1). In embodiments, the first pixel electrode PE1 may be an anode electrode. The first pixel electrode PE1 may be formed of a conductive material such as a metal, an alloy, or a transparent conductive oxide. For example, the conductive material may include silver ("Ag"), indium-tin oxide ("ITO"), and/or the like.

The intermediate layer EL may be disposed on the first pixel electrode PE1. In embodiments, the intermediate layer EL may include an organic light emitting material. In this case, the organic light emitting material may include a low molecular weight organic compound or a high molecular weight organic compound. Alternatively, in embodiments, the intermediate layer EL may include an inorganic light emitting material (e.g., gallium nitrate, etc.). The intermediate layer EL may be a light emitting layer that receives a signal from the first pixel electrode PE1 and the second pixel electrode PE2 and emits light.

The second pixel electrode PE2 may be disposed on the pixel defining layer PDL and the intermediate layer EL. The second pixel electrode PE2 may be formed of a conductive material such as a metal, an alloy, and/or a transparent conductive oxide. In embodiments, the second pixel electrode PE2 may be a cathode electrode. However, the present disclosure is not limited thereto. For example, when the first pixel electrode PE1 may be a cathode electrode, the second pixel electrode PE2 may be an anode electrode. Also, the first pixel electrode PE1 and the second pixel electrode PE2 may be connected to respective sides of the intermediate layer EL on the first via insulating layer VIA1.

Figure 10:
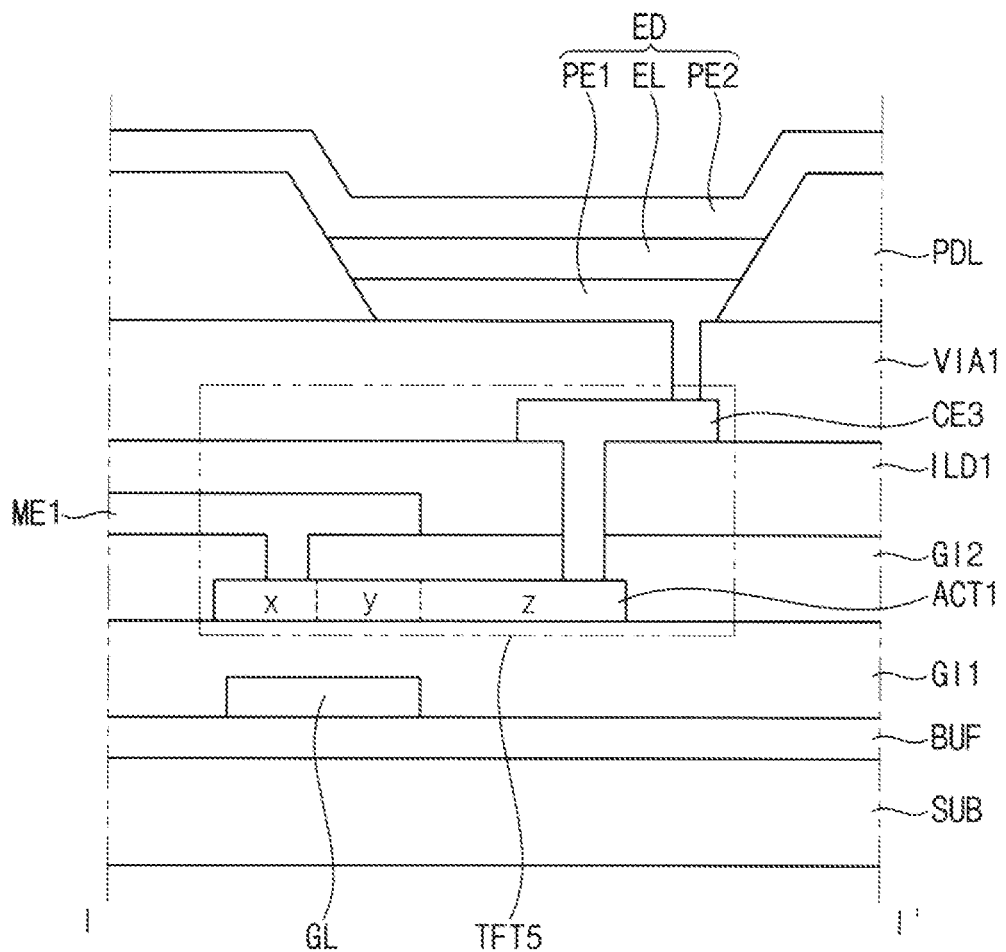
Figure 11:
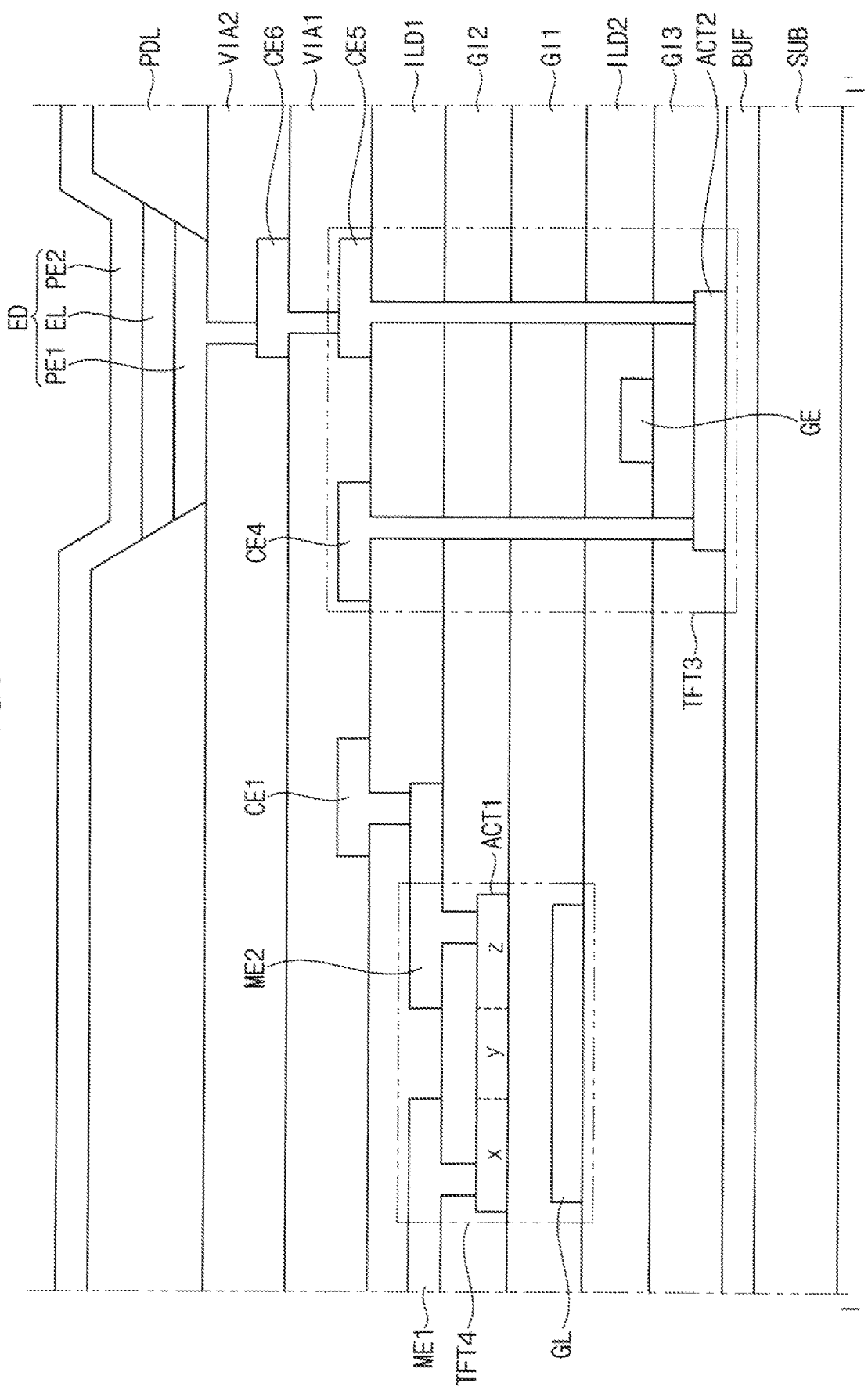
Figure 12:
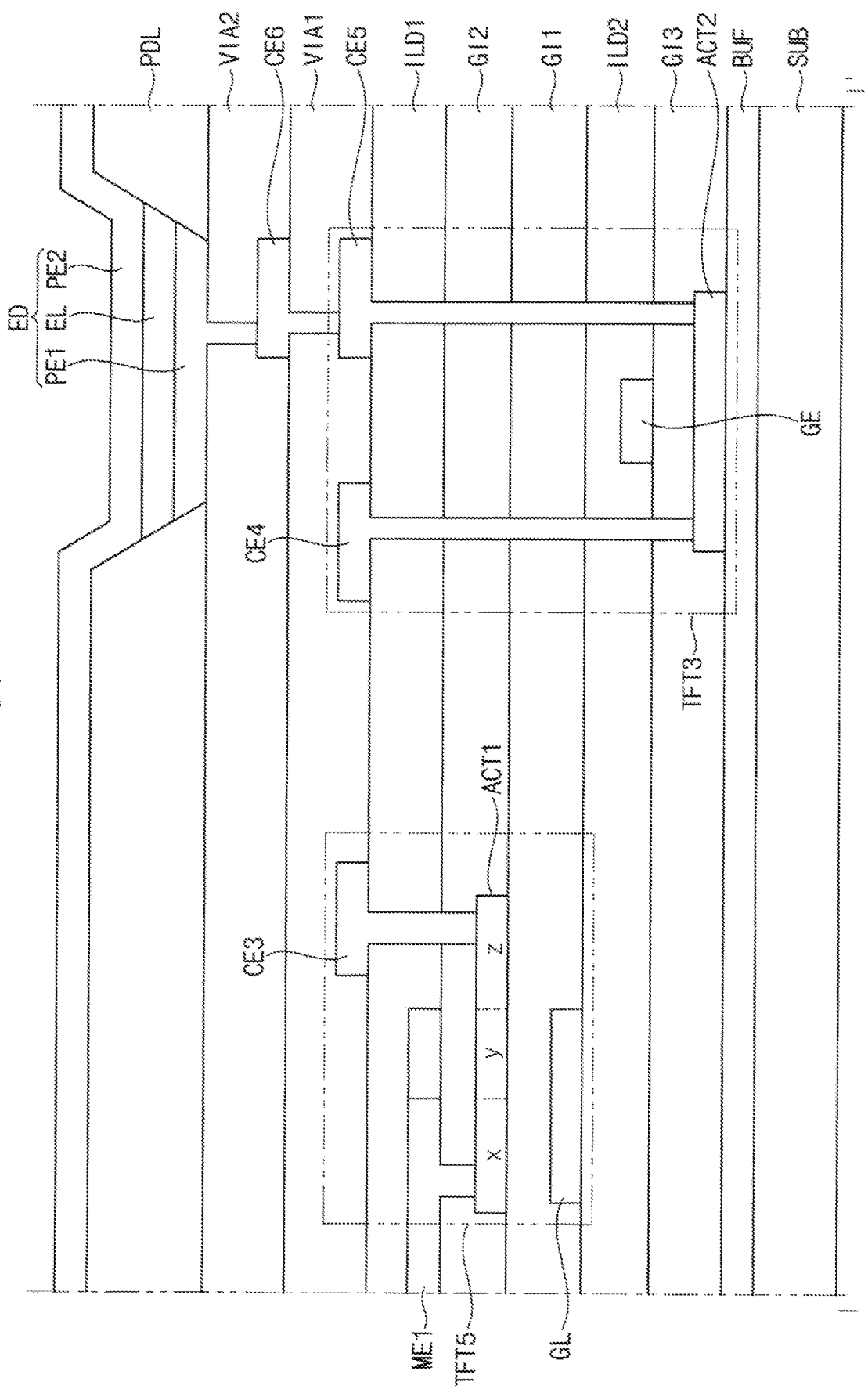

FIGS. 9, 10, 11 and 12 are cross-sectional views illustrating embodiments taken along the line I-I' of FIG. 1. Each of FIGS. 9-12 may be substantially the same as FIGS. 4-7, except that the transistor including the first active layer ACT1 is changed to the miniaturized transistor structure of FIG. 8. Accordingly, a redundant description of the same or similar features may not be repeated. As shown in FIGS. 10 and 12, the lower gate electrode GL, the first active layer ACT1, the first electrode ME1, and the third connection electrode CE3 may constitute a fifth transistor TFT5.

The transistor and display device including the transistor according to the embodiments may be applied to a display device included in a computer, a notebook, a mobile phone, a smart phone, a smart pad, a PMP, a PDA, an MP3 player, and/or the like.

Although the transistor and the display devices including the transistor according to the embodiments have been described with reference to the drawings, the illustrated embodiments are examples, and may be modified and changed by a person having ordinary skill in the art in the relevant technical field without departing from the technical spirit described in the following claims, and equivalents thereof.

What is claimed is:

1. A transistor comprising:
an active layer comprising:
a first end area comprising a first area containing boron ions, and a second area not doped with boron ions;
a middle area adjacent to the first area, and spaced from the second area by the first area; and
a second end area spaced from the first end area by the middle area;
a first electrode on the active layer, overlapping the second area, not overlapping the first area, and connected to the first end area through a first contact hole;
an upper gate electrode on the active layer, overlapping the middle area, at a same layer as the first electrode, and to receive a gate signal; and
a lower gate electrode under the active layer, overlapping the first contact hole and the middle area, and to receive the gate signal.

2. The transistor of claim 1, wherein the first electrode is connected to the second area of the first end area through the first contact hole.

3. The transistor of claim 1, wherein the active layer comprises an oxide-based semiconductor material.

4. The transistor of claim 1, wherein the active layer comprises a silicon-based semiconductor material.

5. The transistor of claim 1, further comprising a second electrode on the active layer, overlapping the second end area, and connected to the second end area through a second contact hole.

6. The transistor of claim 5, wherein the second electrode is at a same layer as the upper gate electrode.

7. The transistor of claim 6, wherein the lower gate electrode overlaps at least a portion of the second end area.

8. The transistor of claim 6, wherein the second end area comprises a first area adjacent to the middle area and a second area spaced from the middle area by the first area, and
wherein the first area of the second end area contains boron ions.

9. The transistor of claim 8, wherein the second electrode is connected to the second area of the second end area through the second contact hole.

10. The transistor of claim 5, wherein the second electrode is on the upper gate electrode.

11. A display device, comprising:
a substrate;
a first active layer on the substrate, comprising:
a first end area comprising a first area containing boron ions, and a second area not doped with boron ions;
a middle area adjacent to the first area, and spaced from the second area by the first area; and
a second end area spaced from the first end area by the middle area;
a first electrode on the first active layer, overlapping the second area, not overlapping the first area, and connected to the first end area through a first contact hole;
an upper gate electrode on the first active layer, overlapping the middle area, to receive a gate signal; and
a lower gate electrode between the substrate and the first active layer, overlapping at least a portion of the first end area and the middle area, and to receive the gate signal.

12. The display device of claim 11, further comprising a second active layer between the substrate and the first active layer.

13. The display device of claim 12, wherein the first active layer comprises an oxide-based semiconductor material, and
wherein the second active layer comprises a silicon-based semiconductor material.

14. The display device of claim 12, wherein the second active layer is connected to a light emitting element.

15. The display device of claim 11, wherein the first electrode is connected to the second area of the first end area through the first contact hole.

16. The display device of claim 11, wherein the upper gate electrode and the first electrode are at a same layer.

17. The display device of claim 11, further comprising a second electrode on the first active layer, overlapping the second end area, and connected to the second end area through a second contact hole.

18. The display device of claim 17, wherein the second electrode is at a same layer as the upper gate electrode.

19. The display device of claim 18, wherein the lower gate electrode overlaps the second end area.

20. The display device of claim 18, wherein the second end area comprises a first area adjacent to the middle area and a second area spaced from the middle area by the first area, and
wherein the second area of the second end area contains boron ions.

21. The display device of claim 20, wherein the second electrode is connected to the second area of the second end area through the second contact hole.

22. The display device of claim 17, wherein the second electrode is on the upper gate electrode.

* * * * *